United States Patent [19]

Morse

[11] 3,774,054

[45] Nov. 20, 1973

[54] VOLTAGE VARIABLE SOLID STATE LINE TYPE MODULATOR

[75] Inventor: Alfred W. Morse, Baltimore, Md.

[73] Assignee: Westinghouse Electric Corporation, Gateway Center, Pittsburgh, Pa.

[22] Filed: Aug. 9, 1971

[21] Appl. No.: 169,980

[52] U.S. Cl. .................... 307/246, 307/324, 328/67

[51] Int. Cl. .................... H03k 17/00

[58] Field of Search .................... 328/67, 65; 307/287, 307/324, 246

[56] References Cited

UNITED STATES PATENTS

| | | | |
|---|---|---|---|
| 3,051,906 | 8/1962 | Haynes | 328/65 X |
| 3,167,661 | 1/1965 | Rhodes | 307/287 X |
| 3,268,822 | 8/1966 | Hickey | 328/65 X |
| 3,584,270 | 6/1971 | Phillips | 317/235 |

OTHER PUBLICATIONS

"Pour-Layer Diode Pulse Modulator" Solid State Design Note July 1962 pgs. 53–55.

*Primary Examiner*—John W. Huckert
*Assistant Examiner*—B. P. Davis
*Attorney*—F. H. Henson et al.

[57] ABSTRACT

A high power radar line type pulsing modulator having a continuously variable operating voltage while utilizing a constant voltage switch comprised of a plurality of series connected two-terminal, four layer semiconductor devices known as reverse switching rectifiers (RSR).

13 Claims, 1 Drawing Figure

PATENTED NOV 20 1973 3,774,054
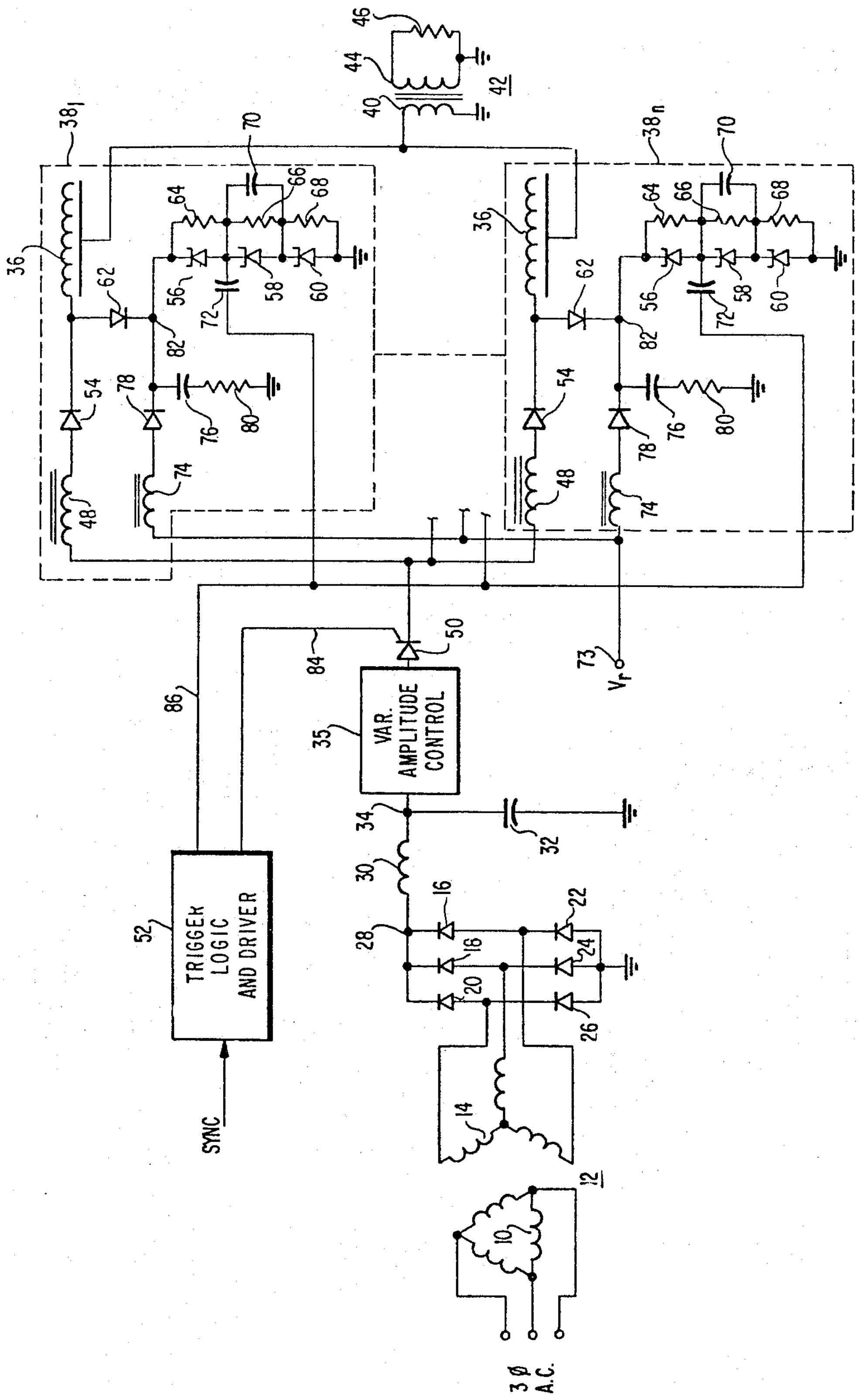

VOLTAGE VARIABLE SOLID STATE LINE TYPE MODULATOR

BACKGROUND OF THE INVENTION

1. Field of the Invention

This invention relates to radar modulator apparatus and more particularly to a line pulsing modulator utilizing solid state devices as the switching element.

2. Description of the Prior Art

There are two types of radar modulators and they are usually triggered by a master timer or synchronizer for producing a high voltage negative pulse which is used to fire the master oscillator power amplifier such as a magnetron in the radar's transmitter section. The amplitude of this pulse will be determined by the type of master oscillator power amplifier used; however, the pulsewidth and pulse repetition frequency will be dependent upon the application of the particular radar set. The line pulsing modulator stores energy and forms pulses in the same circuit element, usually a pulse forming network. The driver hard tube modulator on the other hand forms the pulse in the driver and stores the energy in the modulator circuit. Both of these types of circuits are well known to those skilled in the art, typical examples of which are disclosed in AF Manual 52–8 entitled "Radar Circuit Analyses," Department of the Air Force at pages 11–28 through 11–35, inclusive.

The present invention, however, is directed to line pulsing modulator circuitry which is comprised of five basic components: (1) a source which provides high voltage to the storage element and modulator; (2) the total impedance in the storage network charge path; (3) a switch which allows the storage network to charge when open and allows the storage network to discharge when closed; (4) a pulse forming network which stores the high voltage provided by the source and determines the shape and width of the high voltage pulse applied to the load; and (5) the load which usually incorporates the primary winding of a pulse transformer coupled to the master oscillator power amplifier.

In advancing the state of the art of high power line pulsing modulators, solid state devices have been employed as the switching element for controlling the charge and discharge of the pulse forming network. However, solid state switches utilized in prior art modulators usually require that full operating voltage be impressed across them before switching. The reason for this is that the triggering circuitry is much simpler when trigger energy is derived from the voltage across the switch. It can readily be seen then that a reasonably high voltage must be placed across the switch before proper triggering can occur. In practice, the voltage must be at least 90 percent of its full value for proper operation.

Also in an actual transmitter application, the modulator must drive an active load, e.g., a magnetron tube. Therefore, it is very desirable to be able to raise the tube's beam voltage gradually. However, this is not conducive to proper operation of solid state switches. Also, it is often desirable to operate a transmitter at reduced power by lowering the beam voltage. The tube's beam voltage, on the other hand, is proportional to the modulator output voltage and must therefore be varied by changing the operating voltage of the modulator. This again is not ordinarily conducive to proper operation of a semiconductor switch.

SUMMARY

It is an object of the present invention, therefore, to provide an improved line type radar modulator utilizing solid state semiconductor switches wherein variable operating voltage for the modulator can be utilized wtihout affecting the operation of the semiconductor modulator switch. Briefly, the subject invention comprises a pulse forming network coupled between a load and a high voltage power supply potential which may be variable when desirable. A constant voltage switch is coupled between one side of the pulse forming network through a blocking diode and a point of reference potential which is also common to one side of the load. The constant voltage switch is comprised in the preferred embodiment of three series connected two-terminal, four layer semiconductor switch devices, preferably reverse switching rectifiers (RSR), each of which is shunted by a resistor. The intermediate semiconductor device is also shunted by a capacitor. A constant voltage power supply potential having an amplitude capable of switching one semiconductor device alone is coupled across the series combination which are thereby held in a normally non-conductive state. Means are also coupled to one side of the first semiconductor device nearest the blocking diode for periodically returning one electrode thereof to the point of reference potential whereupon it switches causing the other semiconductor switch devices to sequentially switch to provide a discharge path for the pulse forming network.

BRIEF DESCRIPTION OF THE DRAWING

The FIGURE disclosed is a schematic diagram of a radar modulator including a preferred embodiment of the subject invention.

DESCRIPTION OF THE PREFERRED EMBODIMENT

Referring now to the drawing, reference numeral 10 generally refers to a delta-connected three phase primary winding circuit for a high voltage power transformer 12 which also includes a Y-connected three phase secondary circuit 14. A three phase full-wave rectifier circuit comprised of six semiconductor diode rectifiers 16, 18, 20, 22, 24 and 26 provide a substantially DC voltage at circuit junction 28 which is common to the cathode electrodes of diodes 16, 18 and 20. The anode electrodes of diode 22, 24 and 26, on the other hand, are returned to a point of reference potential hereinafter referred to as ground. An L-C filter comprised of an inductance 30 and a capacitor 32 provides a filtered high voltage DC potential at circuit junction 34. The voltage appearing at junction 34 is applied to a voltage amplitude control circuit 35, the output of which constitutes the source voltage for resonantly charging the pulse forming network 36 included in each of a plurality of identical parallel connected variable voltage modulator units $38_1$ . . . $38_n$. Each pulse forming network 36 is commonly coupled to the primary winding 40 of an output pulse transformer 42 whose secondary winding 44 is connected to a load 46 which may consist of a pulse microwave generator such as a magnetron.

It is the modulator units $38_1$ . . . $38_n$ to which the subject invention is primarily directed. In addition to the pulse forming network 36, each modulator unit for example unit 38, is comprised of an inductance 48 which is coupled to the variable high voltage present at the output of the control circuit 35 by means of a silicon controlled rectifier (SCR) 50. The SCR 50 is periodically triggered "on" by means of a trigger logic and driver circuit 52 which is controlled from a synchronizer pulse signal applied from a master timer circuit, not shown. When SCR 50 is turned "on," the pulse forming network 36 resonantly charges through the fixed inductance 48 and a charging diode 54.

The switch portion of each modulator unit $38_1$ . . . $38_n$ is comprised of three identical semiconductor devices 56, 58 and 60 which are connected in series in the same current conducting direction, i.e., the reverse direction between ground and the cathode electrode of a semiconductor blocking diode 62 whose anode is connected to the supply voltage side of the pulse forming network 36.

The semiconductor devices 56, 58 and 60 are high power devices preferably comprised of but not limited to two-terminal, four layer PNPN devices similar to Shockley diodes and which are capable of operating at high voltages. More particularly, these devices are preferably comprised of switching rectifiers which are disclosed in detail in U. S. Pat. No. 3,584,270, entitled "High Speed Switching Rectifier" which issued on June 8, 1971, in the name of John Philips. In the forward direction the reverse switching rectifier, hereinafter referred to as an RSR, conducts current as in a normal junction rectifier. In the reverse direction the device will initially block voltage; however, at a certain voltage and current, it will switch to a low impedance state where it will remain until the current is reduced to zero. The reverse switching voltage on these devices are in the range of from 600 to 1,000 volts and can conduct currents in the order of 1,000 amperes under certain conditions without detrimental effects, thus making it particularly useful in high voltage modulator applications.

Each of the RSR semiconductor devices 56, 58 and 60 are shunted by respective resistors 64, 66 and 68. RSR 58 and resistor 66, moreover, are shunted by a capacitor 70. A coupling capacitor 72 is coupled to the common junction between RSR 56 and 58 for the application of a triggering signal thereto from circuit 52 in a manner to be described subsequently. A constant voltage is applied across the three RSR devices 56, 58 and 60 and their associated resistors by means of a fixed potential $V_r$ applied from a source, not shown, coupled to terminal 73. Terminal 73 is directly connected to a second fixed inductance 74 which is adapted to resonantly charge a capacitor 76 through a second charging diode 78 and the resistor 80. The voltage charge accumulated on the capacitor 76 appears between ground and the cathode electrode of RSR 56 which is common to circuit junction 82. The magnitude of the constant potential across capacitor 76 is selected to be of a magnitude sufficient to switch one of the RSRs, but not two or more connected in series as shown.

In operation, the trigger logic and driver circuit 52 applies a turn-on signal to the gate of SCR 50 over circuit lead 84 whereupon the pulse forming network 36 in each of the modulator units $38_1$ . . . $38_n$ simultaneously resonantly charges through the respective inductance 48 and the diode 54. The magnitude of the high voltage applied may be varied between the range for example of O to $V_r$. Meanwhile, the constant voltage $V_r$ resonantly charges the capacitor 76 by the combination of the inductance 74, resistor 80, and the diode 78. The constant voltage $V_r$ is isolated from the pulse forming network 36 by means of the polarity connection of the diode 62. When the pulse forming network 36 has become charged, the trigger logic and driver circuit 52 returns the capacitor 72 in each of the modulator units to ground potential by means of circuit lead 86. The anode of RSR 56 is virtually at ground potential due to the fact that the charge on capacitor 72 cannot change instantaneously, therefore, the voltage $V_r$ is placed across RSR 56 which causes it to switch to a fully conductive state. When RSR 56 switches, the voltage $V_r$ appearing at circuit junction 82 appears across RSR 60 through capacitor 70 causing it to switch. With RSRs 56 and 60 in a closed switch condition, the anode of RSR 58 is at ground potential while the constant voltage $V_r$ appearing at circuit junction 82 appears at its cathode which immediately causes it to switch also. With all three RSR devices 56, 58 and 60 in a closed switch condition, capacitor 76 rapidly discharges in accordance with the RC time constant provided by the resistor 80 and circuit junction 82 becomes virtually at ground potential whereupon the pulse forming network discharges through the semiconductor diode 62 and the conducting RSRs 56, 58 and 60 and the primary winding 40 of pulse transformer which in turn generates a high energy pulse for application to the load 46.

It should also be pointed out that the magnitude of the voltage applied to the pulse forming network 36 should be less than the constant voltage $V_r$ applied to circuit junction 82 inasmuch as diode 62 will become conductive whenever the voltage applied to the pulse forming network and consequently the anode of diode 62 is greater than that appearing at its cathode which is common to circuit junction 82.

The combination of the three RSR devices 56, 58 and 60 thus act as a triggerable constant voltage switch for a line pulsing modulator which is adapted to have a continuously variable operating voltage applied to its pulse forming network. Not only is the operation of the RSR devices comprising the constant voltage switch independent of the pulse forming network operating voltage, but the auxiliary firing circuit which is shown as the trigger logic and driver circuit 52 is also adapted to be relatively small in size, consumes relatively little power, and has negligible effect on the overall modulator efficiency.

It is to be understood that the embodiment of the invention herewith shown and described is to be construed as a preferred example only, and that various modifications in the choice of elements and arrangement of parts may be resorted to without departing from the spirit of the invention or the scope of the subjoined claims.

I claim as my invention:

1. A solid state line pulsing modulator adapted to operate with a variable operating voltage, comprising in combination:
   - a pulse forming network;
   - an active load;
   - first circuit means coupling said pulse forming network to one side of said load;
   - a first source of high voltage;

second circuit means coupling one end of said pulse forming network to said source of high voltage for charging said network to a relatively high voltage;

a modulator switch comprising normally non-conductive constant voltage semiconductor switch means adapted to operate at high voltages, and having at least two terminals coupled in a reverse current direction between said one end of said pulse forming network and the other side of said load;

isolation diode means coupled in a forward current direction between said one end of said pulse forming network and one terminal of said switch means;

a point of reference potential common to said load;

a second source of high voltage, having a predetermined substantially constant amplitude sufficient to cause said switch means to conduct in the reverse current direction, coupled to one terminal of said switch means; and means coupled to the other terminal of said switch means for selectively applying said point of reference potential thereto whereupon said switch means breaks down and conducts in the reverse direction causing said pulse forming network to then discharge through said isolation diode means and said switch into said load.

2. A solid state line pulsing modulator adapted to operate with a variable operating voltage, comprising in combination:

a pulse forming network;

a load including a microwave oscillator power amplifier, coupled to a point of reference potential;

first circuit means coupling said pulse forming network to said load;

a first source of operating voltage;

second circuit means coupling one end of said pulse forming network to said first source of operating voltage for charging said network to a relatively high voltage;

voltage sensitive semiconductor modulator switch means adapted to have a constant operating voltage applied thereacross and becoming conductive by a sudden application of overvoltage, coupled in a reverse current direction between said one end of said pulse forming network and said point of reference potential;

diode means coupled in a forward current direction between said one end of said pulse forming network and said switch means;

a second source of operating voltage, being substantially constant and at least equal in magnitude to said first source of operating voltage, coupled across said switch means; and means coupled to said switch means for selectively causing an overvoltage across said switch means whereupon said switch means breaks down in the reverse direction causing said pulse forming network to discharge therethrough into said load resulting in a pulsing of said power amplifier.

3. The invention as defined by claim 2 wherein said semiconductor switch means comprises a two-terminal, four layer semiconductor switch device which is adapted to operate at relatively high operating voltages.

4. A solid state line pulsing modulator adapted to operate with a variable operating voltage and producing a relatively high energy signal for pulsing a load such as a master oscillator power amplifier, comprising in combination:

a pulse forming network;

first circuit means coupling said pulse forming network to said load;

a first source of operating voltage;

second circuit means coupling one end of said pulse forming network to said first voltage source for charging said network to a relatively high voltage;

a modulator switch including at least two series connected two-terminal, four layer semiconductor switch devices coupled in their respective reverse current direction to said one end of said pulse forming network and including means coupling a first terminal of the last of said at least two semiconductor switch devices to one side of said load;

diode means, oppositely poled with respect to said at least two semiconductor switch devices, coupling the second terminal of the first of said at least two semiconductor switch devices to said one end of said pulse forming network;

a second source of voltage, having a predetermined amplitude with respect to a point of reference potential, sufficient to switch a single semiconductor switch device but not two devices in series, coupled to the second terminal of said first semiconductor switch device; and means coupled to the first terminal of said first semiconductor switch device for selectively applying said point of reference potential thereto whereupon said first switch device breaks down and conducts in the reverse direction, thereby applying said second source of voltage to said last semiconductor switch device which immediately breaks down and also conducts current in the reverse direction, said pulse forming network then discharging through said diode means and said at least two semiconductor switch devices into said load.

5. The invention as defined by claim 4 wherein said at least two semiconductor switch devices are comprised of reverse switching rectifiers.

6. The invention as defined by claim 4 and additionally including at least a third two-terminal, four layer semiconductor switch device coupled in series in its reverse current direction between said at least two semiconductor switch devices and additionally including capacitance means coupled across said third semiconductor switch device whereby the breakdown of said first semiconductor switch device couples said second source of voltage across said second or last semiconductor switch device causing it to conduct in its reverse direction whereupon the second source of voltage is then applied across said third semiconductor switch device causing it to then conduct in its reverse direction prior to allowing said pulse forming network to discharge.

7. The invention as defined by claim 6 wherein all of said two-terminal, four layer semiconductor switch devices are comprised of reverse switching rectifiers.

8. The invention as defined by claim 7 and additionally including capacitance means coupled across said series combination of semiconductor switch devices and including means coupling said second source of voltage to one side of said capacitance means, said one side being common to said second terminal of said first semiconductor switch device, said capacitance means being adapted to be charged by said second voltage source to said predetermined amplitude.

9. The invention as defined by claim 8 and additionally including an inductance and diode means coupled in series between said second source of voltage and said capacitance means for resonantly charging said capacitance means, said capacitance means becoming discharged when all of said reverse switching rectifiers are rendered conductive in their reverse current direction.

10. The invention as defined by claim 9 and additionally including a resistor respectively shunting each of said reverse switching rectifiers.

11. The invention as defined by claim 10 and additionally including a resistor connected in series circuit combination with said capacitance means, said inductance means and said diode means.

12. The invention as defined by claim 4 wherein said second circuit means includes an inductance and charging diode means coupled in series to said pulse forming network for resonantly charging said pulse forming network from said first source of operating voltage.

13. The invention as defined by claim 4 and additionally including an output pulse transformer having a primary and a secondary winding and including circuit means coupling said first circuit means to said primary winding and said load to said secondary winding.

* * * * *